US009395740B2

(12) United States Patent
Pavao-Moreira et al.

(10) Patent No.: US 9,395,740 B2
(45) Date of Patent: Jul. 19, 2016

(54) TEMPERATURE COEFFICIENT FACTOR CIRCUIT, SEMICONDUCTOR DEVICE, AND RADAR DEVICE

(71) Applicants: Cristian Pavao-Moreira, Frouzins (FR); Birama Goumballa, Larra (FR); Didier Salle, Toulouse (FR)

(72) Inventors: Cristian Pavao-Moreira, Frouzins (FR); Birama Goumballa, Larra (FR); Didier Salle, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/441,246

(22) PCT Filed: Nov. 7, 2012

(86) PCT No.: PCT/IB2012/002670
§ 371 (c)(1),
(2) Date: May 7, 2015

(87) PCT Pub. No.: WO2014/072763
PCT Pub. Date: May 15, 2014

(65) Prior Publication Data
US 2015/0309527 A1 Oct. 29, 2015

(51) Int. Cl.
*H01L 35/00* (2006.01)
*G05F 3/26* (2006.01)
*G05F 3/24* (2006.01)

(52) U.S. Cl.
CPC *G05F 3/262* (2013.01); *G05F 3/24* (2013.01); *G05F 3/245* (2013.01)

(58) Field of Classification Search
CPC ................................ G05F 3/262; H01L 35/00
USPC .......................................................... 327/512
See application file for complete search history.

(56) References Cited

U.S. PATENT DOCUMENTS 5,828,329 A * 10/1998 Burns ..................... G05F 3/225 323/315
6,222,470 B1 4/2001 Schuelke (Continued)

OTHER PUBLICATIONS

International Search Report and Written Opinion correlating to PCT/IB2012/002670 dated Aug. 21, 2013.

(Continued)

*Primary Examiner* — Daniel Puentes
(74) *Attorney, Agent, or Firm* — Charlene R. Jacobsen

(57) ABSTRACT

A temperature coefficient factor circuit is provided which generates a current which varies with temperature according to a programmable temperature coefficient factor. The temperature coefficient factor circuit comprises a first current source providing a first current with a positive temperature coefficient factor, a second current source providing a second current with a negative temperature coefficient factor, a common terminal, a first programmable amplifying current mirror, a second programmable amplifying current mirror and a current output circuit. The first programmable amplifying current mirror provides in dependence of a control signal ctrl an amplified first current to the common terminal. The second programmable amplifying current mirror conducts away in dependence of the control signal ctrl an amplified second current from the common terminal. The current output circuit provides the output current based on a difference current between the amplified first current and the amplified second current.

18 Claims, 6 Drawing Sheets

(56) References Cited

U.S. PATENT DOCUMENTS

| | | | |
|---|---|---|---|
| 7,119,528 | B1 | 10/2006 | Rasmus |
| 7,307,468 | B1 | 12/2007 | Vasudevan |
| 7,839,202 | B2 | 11/2010 | Sengupta et al. |
| 2002/0109539 | A1 | 8/2002 | Takeuchi et al. |
| 2003/0155650 | A1 | 8/2003 | Moon et al. |
| 2005/0248330 | A1 | 11/2005 | Lin et al. |
| 2008/0224761 | A1 | 9/2008 | Deng et al. |
| 2011/0043185 | A1 | 2/2011 | Kim |
| 2012/0056609 | A1 | 3/2012 | Sato |

OTHER PUBLICATIONS

Gunawan, Made et al; "A curvature-Corrected Low-Voltage Bandgap Reference"; IEEE Journal of Solid-State Circuits, vol. 28, No. 6; 4 pages (Jun. 1993).

Deval, Y. et al; "1-Volt Ratiometric Temperature Stable Current Reference"; IEEE International Symposium on Circuits and Systems, Hong Kong; 4 pages (Sep. 6-Dec. 1997).

* cited by examiner

TEMPERATURE COEFFICIENT FACTOR CIRCUIT, SEMICONDUCTOR DEVICE, AND RADAR DEVICE

FIELD OF THE INVENTION

This invention relates to temperature coefficient factor circuits which are current or voltage sources which deliver a current or a voltage which varies with temperature according to a temperature coefficient factor (TCF). This invention further relates to semiconductor devices, and radar devices.

BACKGROUND OF THE INVENTION

An operation of specific electronic circuits may vary together with variations of the temperature of the electronic circuit. Transistors and diodes junctions have a current/voltage relationship that varies with temperature. The variations may introduce uncertainties in the operation of the electronic circuits and may degrade the performance of the electronic circuits. Besides transistors and diodes, other parts of the electronic circuits may also be subject to operational variations in dependency of the temperature of the parts. Thus, there is a need for compensating the operation of these devices for temperature variations.

In many circuits voltage references and/or current references are used as a basic fundamental sub-circuit. Many of those current and voltage references are designed to be temperature independent, however, if they provide a well-defined temperature dependent current of voltage, their temperature dependency may be used to compensate for temperature effects in other parts of the circuitry.

The term Temperature Coefficient Factor (TCF) is introduced in this context and it is being used to refer to a slope of a current provided by a current source when the temperature varies. The unit of TCF is ppmK, which means, if the temperature changes with 1 K, the current provided by the current source varies with $1 \cdot 10^{-6}$ A. A temperature compensation circuitry provides, preferably, a current with a well-defined TCF. In literature many examples of TCF circuits are provided which have such a well-defined TCF. In a number of applications, such as, for example, in radar applications, it is desired to have a current source which provides a current with a programmable TCF. Thus, it is required to have a specific TCF in response to a control signal. Traditional approaches are to manufacture a plurality of current sources with different TCF values and only switch on a specific one of the plurality of current sources in dependence of the control signal. Such a programmable TCF circuit requires a lot of circuitry to be manufactured on, for example, an integrated circuit and is, thus, relatively expensive.

In document U.S. Pat. No. 6,222,470 discloses a digitally programmable temperature coefficient factor (TCF) circuit. The circuit provides a reference current or a reference voltage which value varies with temperature in dependence of a programmable TCF. The reference voltage is obtained by providing the reference current to a resistor. The reference current is a summation of a first current and a second current. The first current has a programmable value and is a programmable portion of a first maximum current $I1_{max}$ which has a well-defined TCF. The second current has a programmable value and is a programmable portion of a second maximum current $I1_{ma}$, which does not vary with temperature. The first current is generated by a first Digital-to-Analog-Converter circuit (DAC) which receives the first maximum current with the well-defined TCF and which receives a first digital signal. The first DAC divides the first maximum current in dependence of the first digital signal. The first digital signal may have a maximum value $\mathbf{N1}_{max}$, and the actual value N1, and the DAC divides the first maximum current by the ratio $\mathbf{N1}/\mathbf{N1}_{max}$. Thus, the first current has the value $(\mathbf{N1}/\mathbf{N1}_{max})$-Imax,which implies that the TCF of the first current also varies with the value of N1. In this manner the TCF of the reference current provided by the circuit also varies with the value of N1. It is to be noted that the generation of second current is performed in an equal manner, with a second DAC. The value of the second current varies with a value N2, however, it has a TCF of about 0.

The cited patent U.S. Pat. No. 6,222,470 only discloses that the first current, which varies with a programmable TCF, is generated with a DAC. The patent remains silent about the specific implementation of this DAC. Based on the disclosure of document, it may be concluded that if the TCF of the first maximum current is positive, the circuitry of U.S. Pat. No. 6,222,470 can only generated reference currents with a positive first maximum current, which is in specific applications a major limitation. Further, although the implementation of the DAC's is not disclosed, it is expected that when they have to be implemented on silicon, they are a relatively large and, thus, expensive circuit.

SUMMARY OF THE INVENTION

The present invention provides a temperature coefficient factor circuit, a semiconductor device, and a radar device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
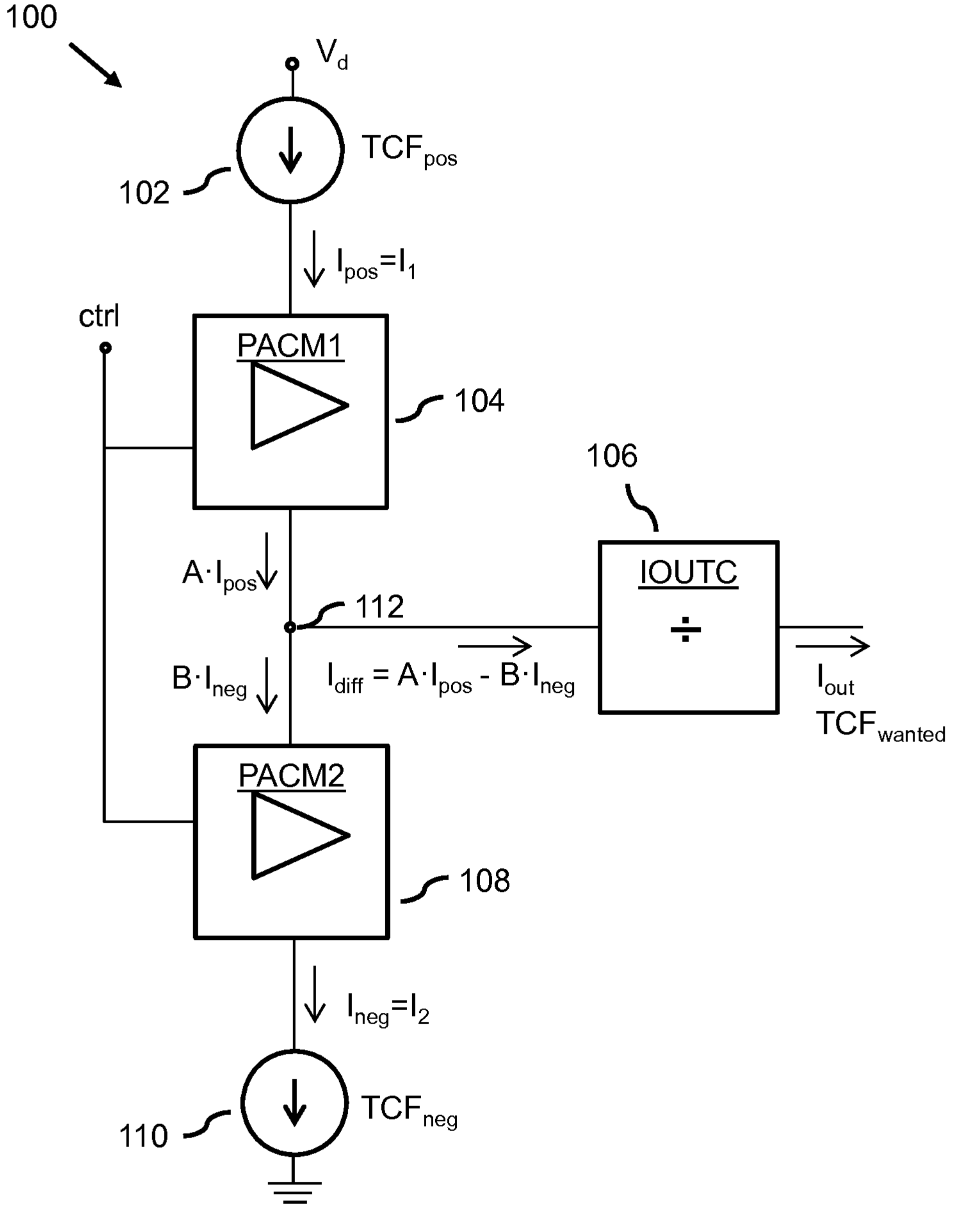
FIG. 1 schematically shows a first example of a temperature coefficient factor circuit according to a first aspect of the invention, FIG. 2 schematically shows a second example of a temperature coefficient factor circuit, FIG. 3 schematically shows a third example of a temperature coefficient factor circuit, FIG. 4 schematically shows a fourth example of a temperature coefficient factor circuit, FIG. 5 schematically shows an example of a first programmable amplifying current mirror, and FIG. 6 schematically shows an example of a first current source and of a second current source.

FIG. 1 schematically shows a first example of a temperature coefficient factor (TCF) circuit 100 according to a first aspect of the invention. The TCF circuit 100 comprises a first current source 102, a second current source 110, a common node 112, a first programmable amplifying current mirror PACM1, 104, a second programmable amplifying current mirror PACM2, 108, a current output circuit IOUTC, 106.

The first current source 102 provides, in operation, a first current $I_{pos}$ which varies with the temperature according to a first temperature coefficient factor $TCF_{pos}$ which has a positive value. The second current source 110 provides, in operation, a second current $I_{neg}$ which varies with the temperature according to a second temperature coefficient factor $TCF_{neg}$ which has a negative value.

The first programmable amplifying current mirror PACM1 receives the first current $I_{pos}$, receives a control signal ctrl and is coupled to the common terminal 112. The first programmable amplifying current mirror PACM1 conducts a first amplified current $A \cdot I_{pos}$ to the common terminal 112. The received first current $I_{pos}$ is amplified towards the first amplified current $A \cdot I_{pos}$ according to a first amplification factor A. The first amplification factor A is adapted in dependence of the control signal ctrl.

The second programmable amplifying current mirror PACM2 receives the second current $I_{neg}$, receives the control signal ctrl and is coupled to the common terminal 112. The second programmable amplifying current mirror PACM2 conducts a second amplified current $B \cdot I_{neg}$ away from the common terminal 112. The received second current $I_{neg}$ is amplified towards the second amplified current $B \cdot I_{neg}$ according to a second amplification factor B. The second amplification factor B is adapted in dependence of the control signal ctrl.

The output current circuit IOUTC, 106 is coupled to the common terminal 112 and conducts a difference current $I_{diff}$ away from the common terminal 112. The difference current $I_{diff}$ is substantially equal to the first amplified current $A \cdot I_{pos}$ minus the second amplified current $B \cdot I_{neg}$. The output current circuit IOUTC, 106 provides, in operation, an output current $I_{out}$ which varies with a required temperature coefficient factor $TCF_{wanted}$ The output current $I_{out}$ is based on the difference current.

The operation of the circuit is explained on basis of a mathematical deduction:

It is known that:

$$TCF = \frac{\partial I}{\partial T} \cdot \frac{1}{I} \tag{1}$$

$$I_{diff} = A \cdot I_{pos} - B \cdot I_{neg} \tag{2}$$

The derivative of (2) with respect to T is:

$$\frac{\partial I_{diff}}{\partial T} = A \cdot \frac{\partial I_{pos}}{\partial T} - B \cdot \frac{\partial I_{neg}}{\partial T} \tag{3}$$

When (1) and (3) are combined, and when it is assumed that $I_{out}=I_{diff}$, one gets:

$$I_{diff} \cdot TCF_{wanted} = A \cdot I_{pos} \cdot TCF_{pos} - B \cdot I_{neg} \cdot TCF_{neg} \tag{4}$$

If one assumes that $I_{pos}=I_{neg}=I$, and $I_{diff}$ is replaced by (2) in formula (4), and the result is rewritten to, one gets:

$$TCF_{wanted} = \frac{A \cdot TCF_{pos} - B \cdot TCF_{neg}}{A - B} \tag{5}$$

Thus, formula (5) shows that the TCF of the output current is a combination of the TCF of the first current source and the TCF of the second current source and that the TCF of the output current depends on the TCF of the first current source and of the second current source by the amplification factors A and B. If it is assumed that $$R = \frac{A}{B}$$

and formula (5) is rearranged, one gets:

$$R = \frac{TCF_{wanted} - TCF_{neg}}{TCF_{wanted} - TCF_{pos}} \tag{6}$$

Thus, with formula (6) R can be calculated and subsequently the amplification factors A and B may be chosen such that the ratio of the chosen amplification factor A and B are close the ratio R which is calculated with formula (6).

In a practical embodiment, the control signal comprises information about the wanted TCF $TCF_{wanted}$, the TCF of the first current course $TCF_{pos}$, and the TCF of the second current source $TCF_{neg}$. Subsequently, a controller of the first programmable amplifying current mirror PACM1 calculates a value R, selects values A and B, and uses the value A as it's amplification factor. A controller of the second programmable amplifying current mirror PACM2 calculates a value R, selects values A and B, and uses the value B as it's amplification factor. The second programmable amplifying current mirror PACM2 selects the values A and B in the same manner as the first programmable amplifying current mirror PACM1. The selected values A and B results in a value $$R_{selected} = \frac{A_{selected}}{B_{selected}}$$

which is approximately the value R of formula (6). In an embodiment, the value $R_{selected}$ does not deviate more than 10% from the calculated value R of formula (6). In an embodiment, the value $R_{selected}$ does not deviate more than 5% from the calculated value R of formula (6). In another embodiment, the first programmable amplifying current mirror PACM1 and the second programmable amplifying current mirror PACM2 have the capability to only use an amplification factor from a predefined set of amplification factors $A_1 \ldots A_n$, $B_i \ldots B_m$ and from this predefined set of amplification a combination of one $A_x$ amplification factor and one $B_y$ amplification factor is selected such that the $$R = \frac{A_x}{B_y}$$

is closed to the ration R calculated by formula (6) and such that other factors based on other selections are less close to the ratio R calculated by formula (6).

It is to be noted that it is assumed in the previous paragraph that the TCF of the first current source and of the second current source have a fixed value. However, in general, the embodiments falling within the scope of the invention of this application are not limited to first current source and of the second current source have a fixed TCF. In specific embodiments the TCF of the first current source and of the second current source may be changed to a required value.

In an example: Assume that the TCF of the first current source is $TCF_{pos}$=3504 ppmK and the TCF of the second current source is $TCF_{neg}$=−1450 ppmK. These values may be the result of a specifically designed current source and may be measured after manufacturing the respective current source. If, for example, the required TCF of the output current $TCF_{wanted}$=4500 ppmK, than the ratio R, calculated with formula (6) is R=5.97. If the first amplification factor is chosen to be A=6 and if the second amplification factor is chosen to be B=1, than, the selected ratio $R_{selected}$=6, which is relatively close to the calculated value. Thus, the first programmable amplifying current mirror PACM1 amplifies current $I_{pos}$ with a factor 6, and the second programmable amplifying current mirror PACM2 amplifies current $I_{neg}$ with a factor 1.

In summary, FIG. 1 shows a temperature coefficient factor circuit 100 which generates a current $I_{out}$ which varies with temperature according to a programmable temperature coefficient factor $TCF_{wanted}$ The temperature coefficient factor circuit 100 comprises a first current source 102 providing a first current with a positive temperature coefficient factor $TCF_{pos}$, a second current source 110 providing a second current with a negative temperature coefficient factor $TCF_{neg}$, a common terminal 112, a first programmable amplifying current mirror PACM1, a second programmable amplifying current mirror PACM2 and a current output circuit IOUTC. The first programmable amplifying current mirror PACM1 provides in dependence of a control signal ctrl an amplified first current to the common terminal 112. The second programmable amplifying current mirror PACM2 conducts away in dependence of the control signal ctrl an amplified second current from the common terminal 112. The current output circuit IOUTC provides the output current $I_{out}$ based on a difference current between the amplified first current and the amplified second current.

Figure 2:
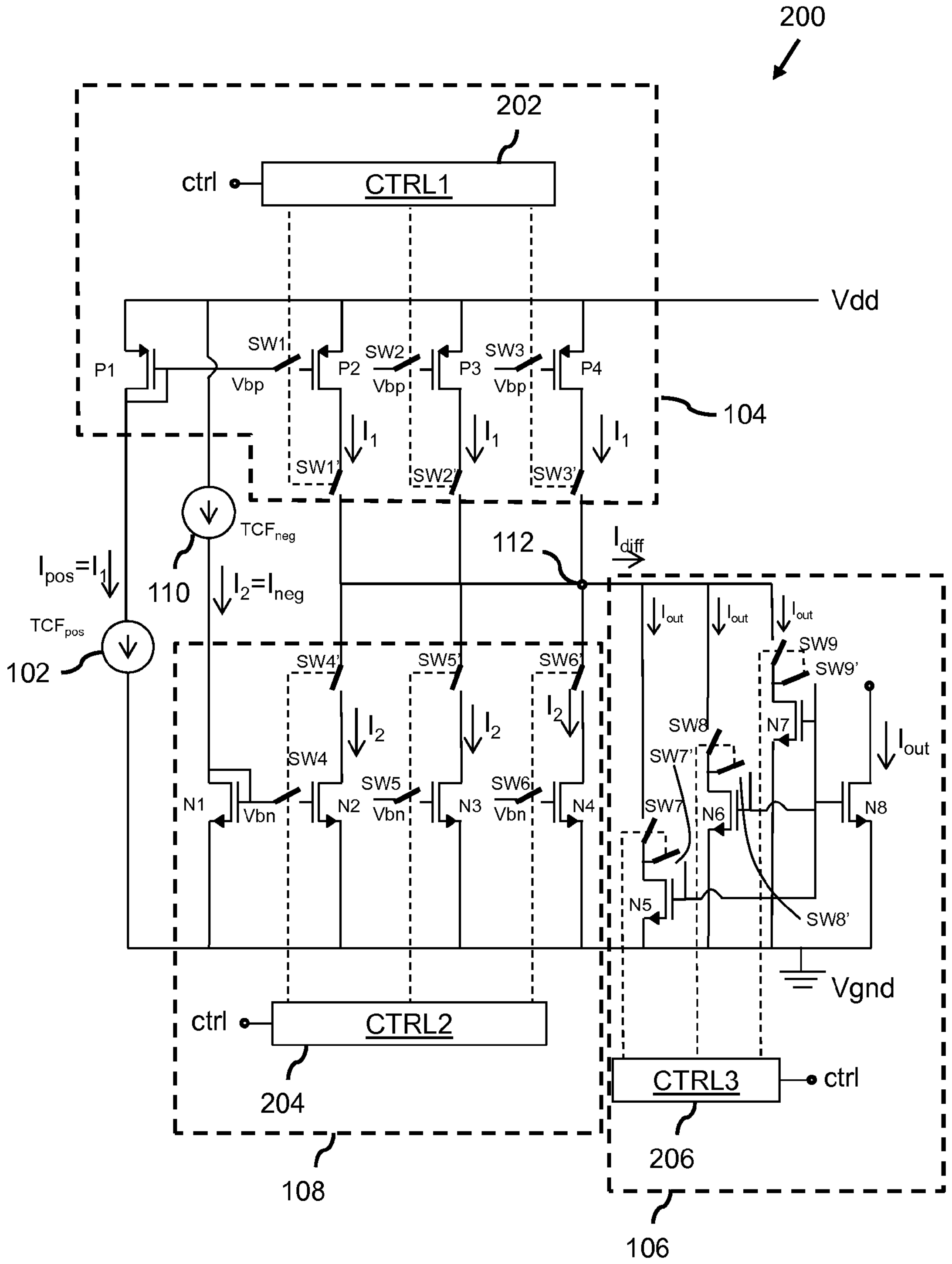

FIG. 2 schematically shows a second example of a temperature coefficient factor circuit 200. The temperature coefficient factor circuit comprises a first current source 102, a second current source 110, a first programmable amplifying current mirror 104, a second programmable amplifying current mirror 108, a common node 112 and a current output circuit 106. The first current source 102 and the second current source 110 have characteristics which have already been discussed in the context of FIG. 1.

The first programmable amplifying current mirror 104 comprises a first controller CTRL1, 202, a first MOS transistor P1 and a plurality of parallel arranged first mirror MOS transistor P2 . . .P4. The first MOS transistor P1 and the plurality of parallel arranged first mirror MOS transistor P2 . . . P4 are all of P-type, and that they have similar characteristics (such as gate width and length). The first MOS transistor P1 is arranged with its source-drain current conduction path in the current path of the current delivered by the first current source 102. A drain of the first MOS transistor P1 is coupled to a gate of the first MOS transistor P1. Each one of the plurality of parallel arranged first mirror MOS transistor P2 . . . P4 may be coupled with its gate, via a controllable switch SW1 . . . SW3 to the gate of the first MOS transistor P1. If such a first mirror MOS transistor is coupled to the gate of the first MOS transistor P1, it forms together with the first MOS transistor P1 a current mirror circuit and, if the first current $I_{pos}=I_1$ flows through the first MOS transistor P1, the same first current flows through the first mirror MOS transistor P2 . . . P4 which are coupled with its gate to the gate of the first MOS transistor P1. The first mirror MOS transistors P2 . . . P4 are coupled with a controllable switch SW1' . . . SW3' to the common node 112. Each one of the controllable switches SW. . . SW3 forms a pair with a corresponding controllable switch SW1' . . . SW3'. If one of the controllable switches SW1 . . . SW3 is closed, the corresponding controllable switch SW1'. . . SW3' is closed such that the mirrored first current provided by a specific one of the first mirror MOS transistor P2 . . . P4 is conducted towards the common node 112. If, for example, controllable switch pair SW1-SW1' and controllable switch pair SW2-SW2' are closed and controllable switch pair SW3-SW3' is not closed, two times the current is provided to the common node 112, and, thus, the amplification factor of the first programmable amplifying current mirror 104 is A=2. The first controller ctrll is configured to close or open the controllable switch pairs SW1-SW1' SW3-SW3' in dependence of the control signal ctrl. As discussed in the context of FIG. 1, the first controller may calculate a required value R and select an amplification factor A, and in line with the selected amplification factor A a corresponding number of controllable switch pairs SW1-SW1' SW3-SW3' is closed.

The second programmable amplifying current mirror 108 comprises a second controller CTRL2, 204, a second MOS transistor N1 and a plurality of parallel arranged second mirror MOS transistor N2 . . . N4. The second MOS transistor N1 and the plurality of parallel arranged second mirror MOS transistor N2 . . . N4 are all of an N-type, and that they have similar characteristics (such as gate width and length). The second MOS transistor N1 is arranged with its source-drain current conduction path in the current path of the current delivered by the second current source 110. A drain of the second MOS transistor N1 is coupled to a gate of the second MOS transistor N1. Each one of the plurality of parallel arranged second mirror MOS transistor N2 . . . N4 may be coupled with its gate, via a controllable switch SW4 . . . SW6 to the gate of the second MOS transistor N1. If such a second mirror MOS transistor is coupled to the gate of the second MOS transistor N1, it forms together with the second MOS transistor N1 a current mirror circuit and, if the second current $I_{neg}=I_2$ flows through the second MOS transistor N1, the same second current $I_2$ flows through the second mirror MOS transistor N2 . . . N4 which are coupled with its gate to the gate of the second MOS transistor N1. The second mirror MOS transistors N2 . . . N4 are coupled with a controllable switch SW4'. . . SW6' to the common node 112. Each one of the controllable switches SW4 . . . SW6 forms a pair with a corresponding controllable switch SW4'. . . SW6'. If one of the controllable switches SW4 . . . SW6 is closed, the corresponding controllable switch SW4'. . . SW6' is closed such that the mirrored second current provided by a specific one of the second mirror MOS transistor N2 . . . N4 is conducted away from the common node 112. If, for example, controllable switch pair SW4-SW4' and controllable switch pair SW5-SW5' are closed and controllable switch pair SW6-SW6' is not closed, two times the current $I_2$ is conducted away from the common node 112, and, thus, the amplification factor of the second programmable amplifying current mirror 108 is B=2. The second controller ctrl2 is configured to close or open the controllable switch pairs SW4-SW4 ' SW6-SW6' in dependence of the control signal ctrl. As discussed in the context of FIG. 1, the second controller may calculate a required value R and select an amplification factor B, and in line with the selected amplification factor B a corresponding number of controllable switch pairs SW4-SW4' SW6-SW6' is closed.

The output current circuit 106 receives the difference current $I_{diff}$ and provides the output current $I_{out}$. It may be advantageous if the output current $I_{out}$ has, except variations which depend on the temperature coefficient factor $TCF_{wanted}$, a substantially constant value which does not depend on the amplification factors A and B. Namely, if we assume that the first current and the second current $I_2$ are, except variations which depend on the temperature coefficient factor $TCF_{pos}$ and $TCF_{neg}$, substantially equal to eachother, $I_{diff}$ has the value: $I_{diff}$=A·I−B·$I_1$ and, thus, the value depends on the amplification factor A and B. The output current circuit 106 is configured to divide the current $I_{diff}$ with a divisor C such that the value of $I_{out}$, except variations of the value of this current which depend on temperature differences and different value for the temperature coefficient factor $TCF_{wante}$, is substantially constant, and, in an embodiment, is substantially equal to the first current The divisor C has to be equal to A-B.

The output current circuit 106 comprises a plurality of parallel arranged output mirror MOS transistors N5 . . . N7, an output MOS transistor N8 and a third controller CTRL3, 206. The plurality of output mirror MOS transistors N5 . . . N7 and the output MOS transistor N8 are of the same type as the second MOS transistor N1 and the plurality of second mirror MOS transistor N2 . . . N4. The plurality of output mirror MOS transistor N5 . . . N7 are arranged in a parallel configuration and may be coupled with a corresponding controllable switch SW7 . . . SW9 in the current conduction path of the difference current $I_{diff}$. The difference current $I_{diff}$ is subdivided over a number of output mirror MOS transistors N5 . . . N7 which are with the controllable switch SW7 . . . SW9 in the current conduction path of the difference current $I_{diff}$. Each one of the controllable switches SW7 . . . SW9 forms a pair with another controllable switch SW7' . . . SW9' which is arranged in an electrical coupling between a drain and a gate of its corresponding output mirror MOS transistor. The controllable switches SW7 . . . SW9-SW7' . . . SW9' are closed and opened pair-wise by the third controller. The gates of all output mirror MOS transistors N5 . . . N7 are coupled to a gate of the output MOS transistor N8, and thereby they form a current mirroring circuit. If, for example, only the controllable switches of the pair SW7-SW7' are closed, and the controllable switches of pairs SW8-SW8' and SW9-SW9' are opened, the current which flows through output mirror MOS transistor N5 is mirrored by output transistor N8 and, thus, $I_{out}=I_{diff}$. If, for example, the controllable switches of the pairs SW7-SW7', SW8-SW8' are closed, and the controllable switches of pair SW9-SW9' are opened, a current which flows through output mirror MOS transistors is equal to $I_{diff2}$ and, consequently, the output current is $I_{out}=I_{diff}/2$. The output current $I_{out}$ can be made substantially equal to the first current provided by the first current source 102 (if one assumes that the first current is substantially equal to the second current $I_2$) if the number of MOS transistors which conduct a current towards the common terminal 112 is equal to the number of MOS transistors which conduct a current $I_2=I_1$ away from the common terminal. Thus, if the first programmable amplifying current mirror 104 closes A switch pairs, and the second programmable amplifying current mirror 108 close B switch pairs, the output current circuit has to close C=A-B switch pairs. It is to be noted that the output current circuit has to close at least one switch pair in order to be able to provide the output current $I_{out}$. Further, it is to be noted that A should always be larger than B. Thus, the third controller CTRL3, 206 receives a control signal crtl which comprises information an $TCF_{pos}$, $TCF_{neg}$ and $TCF_{wanted}$, and calculated, corresponding to the calculations performed by the first controller CTRL1, 202, the second controller CTRL2, 204, the values for A and B, and subsequently calculates C, and subsequently the third controller CTRL3, 206 closes a corresponding number of switch pairs SW7-SW7' . . SW9-SW9'.

In an example, the temperature coefficient factor of the first current source is $TCF_{pos}$=3500 ppmK and the temperature coefficient factor of the second current source is $TCF_{neg}$=−1450, a number of $TCF_{wanted}$ can be created with the circuitry of FIG. 2 (calculation is based on formula (5)), see the subsequent table:

TABLE 1 different possibility for the amplification factors and a corresponding divisor factor

| A | B | C | $TCF_{wanted}$ of $I_{diff}$ |
|---|---|---|---|
| 2 | 1 | 1 | 8450 ppm/K |
| 3 | 1 | 2 | 5975 ppm/K |
| 3 | 2 | 1 | 13400 ppm/K |

It is to be noted that Table 1 is based on the assumption that B is larger than 0, because otherwise the ratio R=A/B would result in an infinite large value, however, the practical implementation of the temperature coefficient factor may include controllers which chose B to be 0.

The example of FIG. 2 is a relatively simple example which may be used to create, for example, three different temperature coefficient values. The number of mirror MOS transistors coupled with a pair is controllable switches SWx-SWx' to a gate of a MOS transistor in each one of the programmable amplifying current mirrors may be larger (andor different from the number presented in FIG. 2), which immediately increases the number of possible temperature coefficient factors which may be created. Thus, the design of the temperature coefficient factor circuit is very flexible in creating, on basis of a control signal, a current with varies with temperature on basis of a temperature coefficient factor selected form a large set with different temperature coefficients. Further, the amount of MOS transistors which need to be implemented in the circuit is relatively small, especially if this is compared to prior art programmable temperature coefficient factor circuits. Thus, the circuit may be smaller when being implemented on a semi-conductor device, and, thus, cheaper.

In FIG. 2 the controllers ctrl1 . . .ctrl3 are drawn as separate parts. However, in practical embodiments, the controllers ctrl1 . . . ctrl3 are not necessary independent controllers. Functionality of the controllers ctrl1 . . . ctrl3 may be shared and provided in a central controller.

Figure 3:
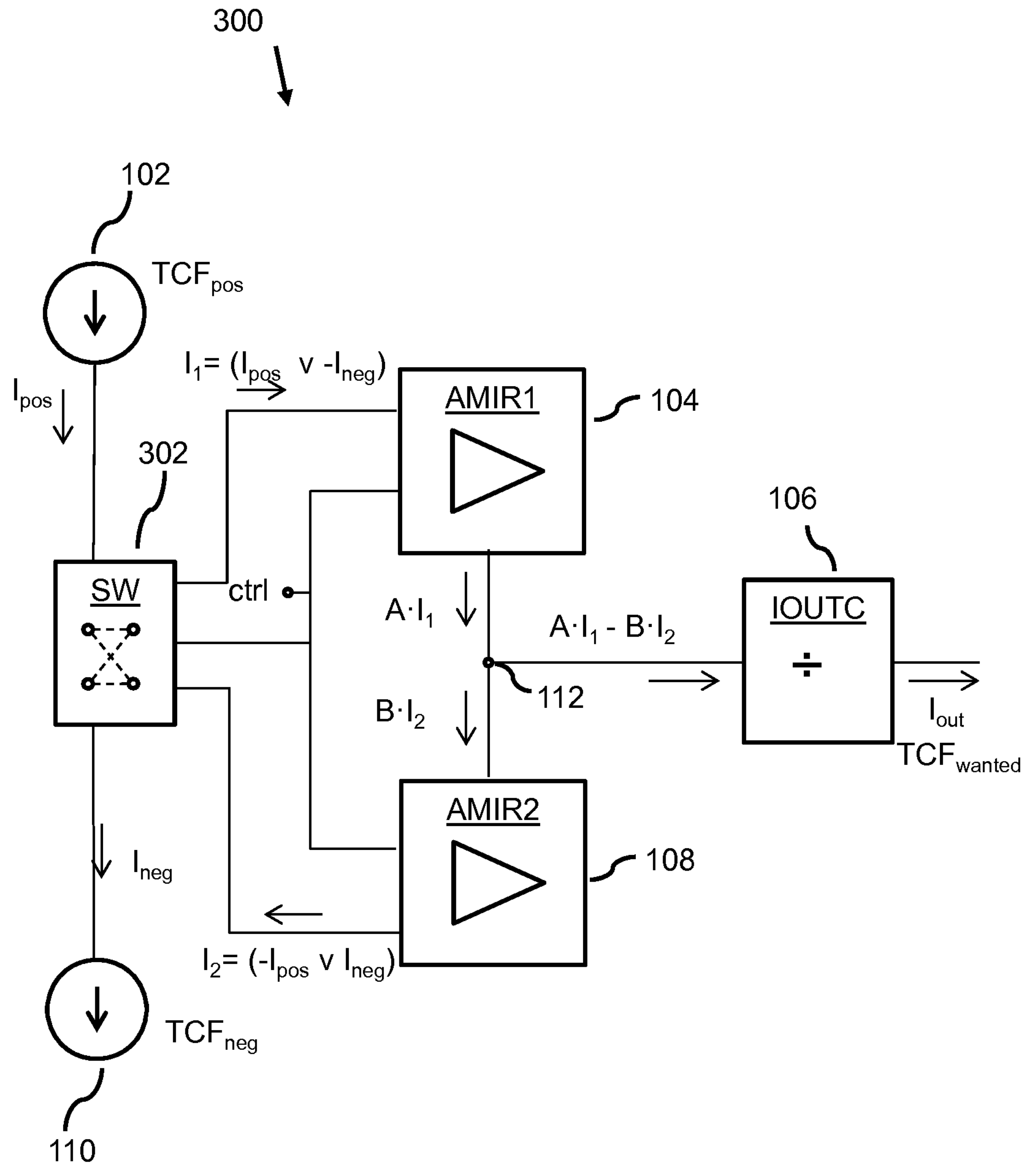

FIG. 3 schematically shows a third example of a temperature coefficient factor circuit 300. The provided embodiment has a solution for the limitation of the coefficient factor circuit 300 in which the amplification factor A should be larger than the amplification factor B. The provided embodiment of the temperature coefficient factor circuit 300 is similar to the circuit of FIG. 1, however, a difference is that the first current $I_{pos}$ provided by the first current source 102 is not directly coupled towards the first programmable amplifying current mirror AMIR1, 104 and that the second current $I_{neg}$ provided by the second current source 110 is not directly coupled towards the second programmable amplifying current mirror AMIR2, 108. The first programmable amplifying current mirror AMIR1, 104 is coupled to a first input current which is either the first current $I_{pos}$ or the negative second current $-I_{neg}$. The second programmable amplifying current mirror AMIR2, 108 is coupled to a second input current $I_2$ which is either the negative first current $-I_{pos}$ or the second current $I_{neg}$. In between the first current source 102 and the second current source 110 at one side, and the first programmable amplifying current mirror AMIR1 and the second programmable amplifying current mirror AMIR2 at the other side, is coupled a switching unit SW which is configured to couple to the first current $I_{neg}$ to one of the first programmable amplifying current mirror AMIR1 or the second programmable amplifying current mirror AMIR2 and which is configured to couple to second current $I_{neg}$ to the other one of the first programmable amplifying current mirror AMIR1 or the second programmable amplifying current mirror AMIR2. The first current is coupled to the first programmable amplifying current mirror AMIR1 and the second current is coupled to the second programmable amplifying current mirror AMIR2 when the amplification factor A is larger than the amplification factor B. If the amplification factor B is larger than the amplification factor A, the coupling is performed the other way around. The switching unit receives also the control signal ctrl comprising information about the temperature coefficient factors $TCF_{pos}$, $TCF_{neg}$, $TCF_{wanted}$, and calculates a required value for R on basis of formula (6), determines the values for A and B in the same manner as earlier described and uses the determined value A and B to couple the first current $I_{pos}$ and second current $I_{neg}$ to one of the first input current or the second input current $I_2$.

As discussed in the context of FIG. 2, the amplification factor B has to smaller than A. If, however, based on formula (6) it has been found that R is for example ½, it would be convenient to have A=1 and B=2. In such a case the switching unit provides a solution, because the switching unit is able to switch the currents $I_{lens}$, $I_{neg}$ provided by the current sources 102, 110 to specific one of the programmable amplifying current mirrors AMIR1, 104, AMIR2, 108. If the current $I_{pos}$ provided by the first current source 102 is coupled to the second programmable amplifying current mirrors AMIR2, 108 and the current $I_{neg}$ provided by the second current source 110 is coupled to the first programmable amplifying current mirrors AMIR1, 104, the determined values for A and B have to be swapped, such that the first programmable amplifying current mirrors AMIR1, 104 applies amplification factor B and the second programmable amplifying current mirrors AMIR2, 108 applies amplification factor A. Thereby, the first programmable amplifying current mirrors AMIR1, 104 has still more first mirror MOS transistors coupled to the first MOS transistor than the number of second mirror MOS transistors coupled to the second MOS transistor.

Figure 4:
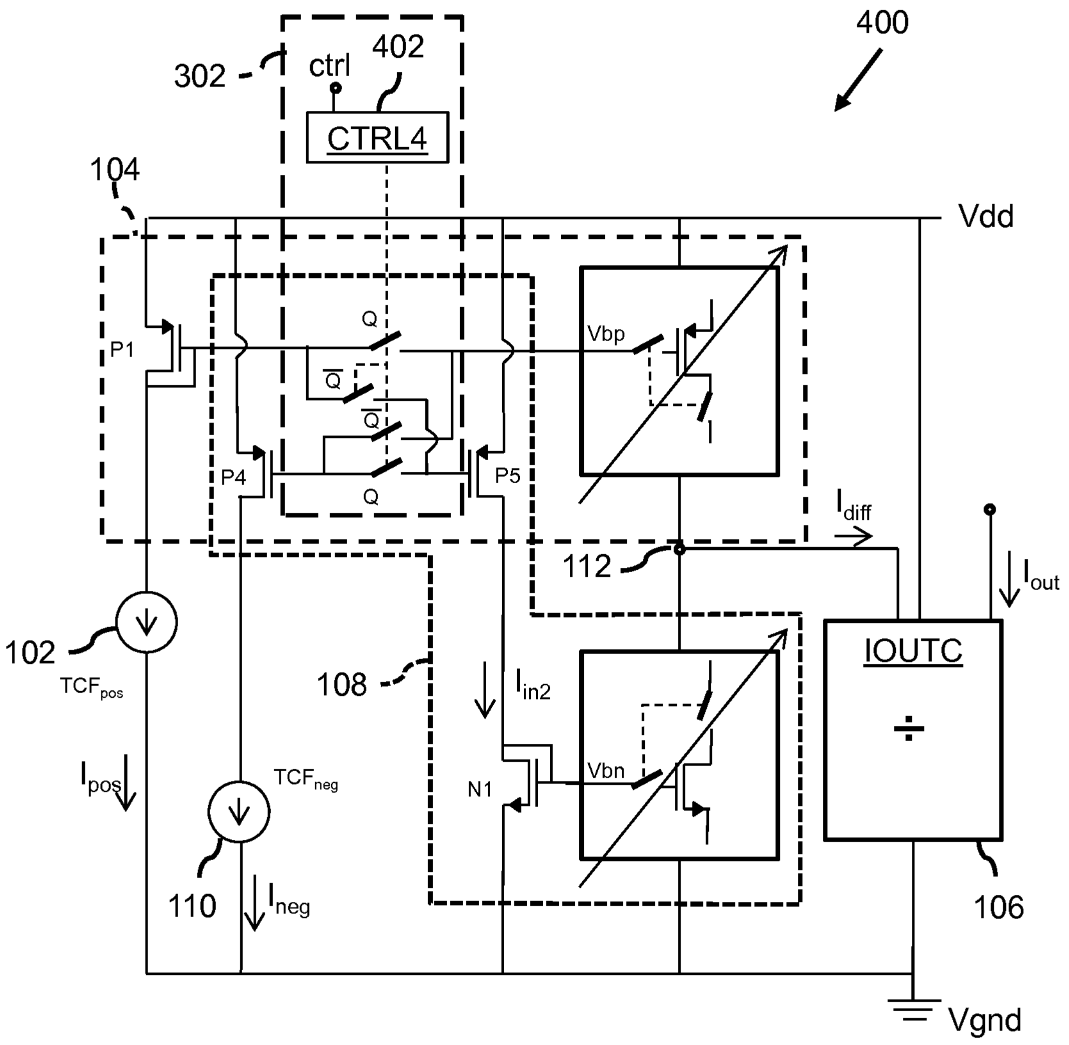

FIG. 4 schematically shows a fourth example of a temperature coefficient factor circuit 400. The shown temperature coefficient factor circuit 400 now comprises the switching unit 302 which has become part of the programmable amplifying current mirrors 104, 108. The switching unit comprise 4 controllable switches Q, $\overline{Q}$ of which two controllable switches Q are open and two controllable switches $\overline{Q}$ are closed, or the other way around in dependence of the amplification factors A and B. In the embodiment of FIG. 4 the switching unit 302 is arranged inside two current mirroring arrangements and, as such, the switching unit 302 couples gates of specific MOS transistors to specific mirroring MOS transistors in the way shown in FIG. 4. In this specific configuration, the switching unit 302 is used to operate as a voltage level switching unit. As such, in FIG. 4, the switching unit 302 is part of the first programmable amplifying current mirrors 104 and of the second programmable amplifying current mirrors 108. The switching unit 302 may also be arranged in the current conduction paths as presented in FIG. 3 and, in that specific configuration, the switching unit 302 acts as a current switch.

Figure 5:
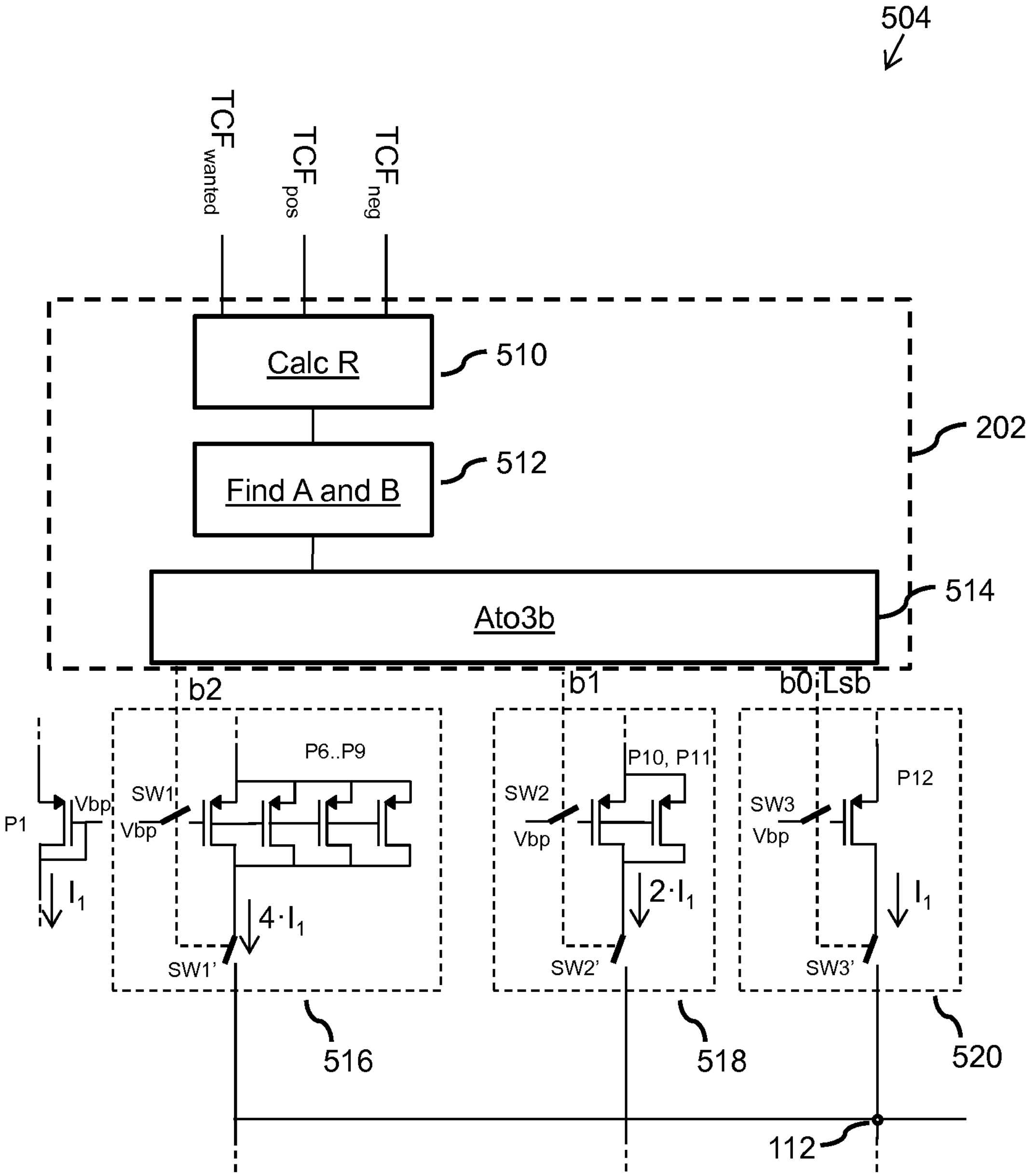

FIG. 5 schematically shows an example of a first programmable amplifying current mirror 504. Especially, the first programmable amplifying current mirror 504 is suitable of using a amplification factor A which has an integer value in the range from 1 to 7. The first programmable amplifying current mirror 504 has a first controller 202 which receives the control signals $TCF_{neg}$, $TCF_{pos}$, $TCF_{wanted}$. These values are used to calculate by a calculation unit CalcR, 510 a value R in according with formula 6. Subsequently, in a finding unit FindAandB, 512, values for A and B are selected, which provide an estimate value for R which is approximately equal to the value of R calculated by the calculation unit CalcR, 510. The meaning of the term 'approximate' in this context has already been discussed in an earlier embodiment. Subsequently, the value of A is used to control different controllable switch pairs SW1-SW1' . . . SW3-SW3'. Each controllable switch pair is part of one of the transistor units 516, 518, 520 which, respectively are configured to provide, respectively 4, 2 and 1 time(s) the current $I_1$ to the common terminal. The A to bits conversion unit A to 3b, 514 is used to convert the value of A to a 3 bits digital number. The least significant bit b0, Lsb is used to control controllable switch pair SW3-SW3' which couples only one first mirror MOS transistor P12 to the received voltage Vbp (which is delivered the first MOS transistor P1 (see also, for example, FIG. 2)). Then, transistor unit 520 provides one time the current $I_1$ to the common terminal 112. The second least significant bit b1 is used to control controllable switch pair SW2-SW2' which couples two first mirror MOS transistor P10, P11 to the received voltage Vbp (which is delivered the first MOS transistor P1). Then, transistor unit 518 provides two times the current $2.I_1$ to the common terminal 112. The most significant bit b2 is used to control controllable switch pair SW1-SW1' which couples four first mirror MOS transistor P6 . . . P9 to the received voltage Vbp (which is delivered the first MOS transistor P1). Then, transistor unit 518 provides two times the current 4-$I_1$ to the common terminal 112. Thus, depending on the values of b2, b1 and b0, at least 1 time the first (input) current $I_1$ is provided to the common terminal 112, or at most 7 times the first (input) current $I_1$ is provided to the common terminal 112.

Based on the teaching of FIG. 5 it is relatively easy for the skilled person to extend the operation of the first programmable amplifying current mirror 504 with adding additional transistor units which comprise, for example, 8, 18, 32, . . . parallel arranged mirror transistors.

Furthermore, the second programmable amplifying current mirror and the output current circuit may be implemented in a similar way as the presented embodiment of first programmable amplifying current mirror 504 by creating transistor units which comprise 2n, with n=0 to e.g. 7, transistors. It is further to be noted that the number of transistors in a single transistor unit are not necessary limited to values which are a power of 2. Depending on the specific application one may select specific numbers of transistors in a transistor unit such that the current with required temperature coefficient factors may be created by the temperature coefficient factor circuit.

By using such flexible programmable amplifying current mirrors, the temperature coefficient factor is able to create currents which have a selected temperature coefficient factor which is selected from a relatively large set of possible temperature coefficient factors. Thus, the circuit provides an enormous flexibility. Further, the amount of MOS transistors used in the circuit is relatively low, especially when the number is compared to circuits in which a plurality of temperature coefficient factor circuits are arranged in parallel and in which only one of the plurality of temperature coefficient factor circuits is used to create a current with a specific temperature coefficient factor.

Figure 6:
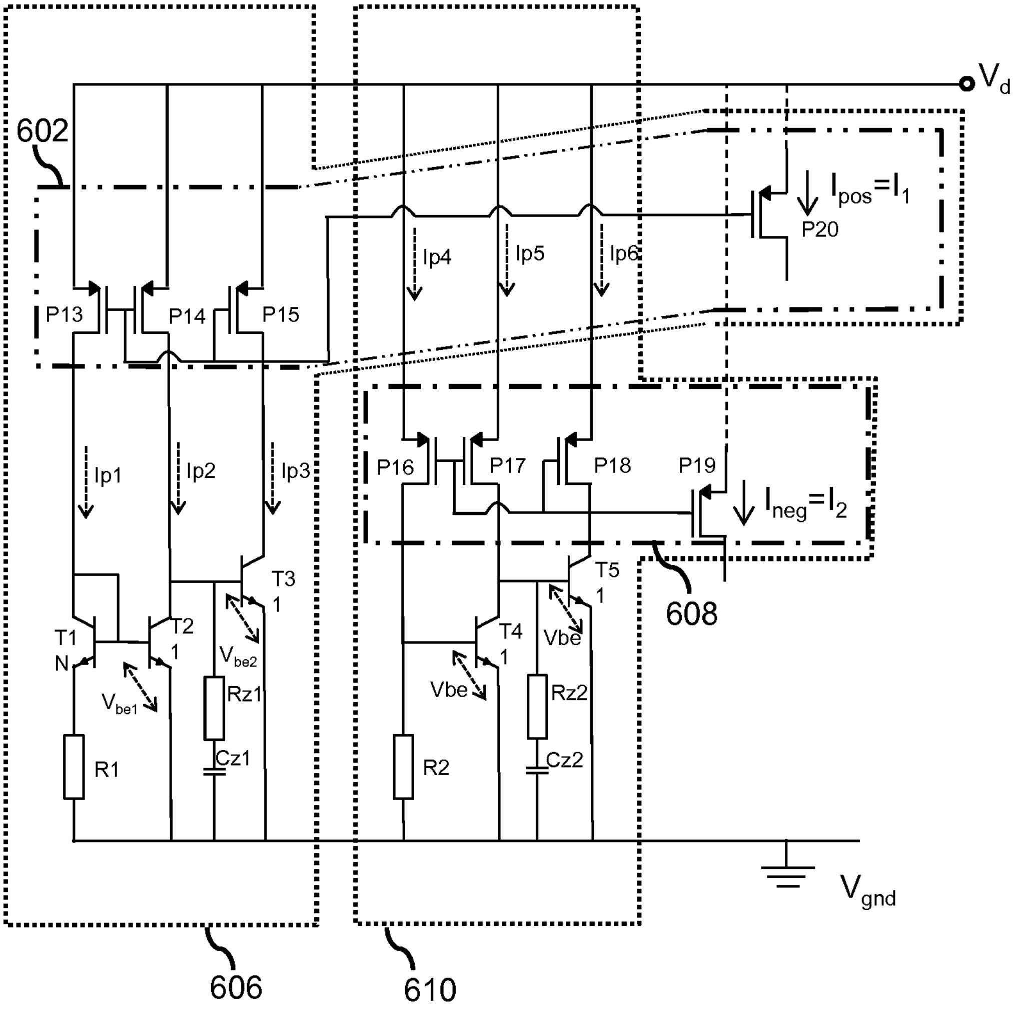

FIG. 6 presents embodiments of current sources 606, 610 which generate a current which varies with a specific temperature coefficient factor TCFpos, TCFneg, and which have a good power supply rejection ratio (PSRR). FIG. 6 presents a part of an exemplary temperature coefficient factor circuit according to one of the previous embodiments. In the example of FIG. 6, it has been assumed that no switching unit (as presented in FIGS. 3 and 4) is present and that the first current $I_{pos}=I_1$ which varies with the temperature according to the positive temperature coefficient factor, is provided by MOS transistor P20 and that the second current $I_{neg}=I_2$, which varies with temperature according to the negative temperature coefficient factor, is provided by MOS transistor P19. In line with the teaching of the embodiments of FIGS. 3 and 4, a switching unit may be provided in between MOS transistors P15 and P18 at one side and MOS transistors P20 and P19 at the other side.

At the left end of FIGS. 6 is provided an example of the first current source 606 which provides a current which varies with temperature according to the positive temperature coefficient factor. The first current source 606 comprises four current conduction paths, which are a first current path lot a second current path Ip2, a third current path Ip3 and a first output current path $I_{pos}=I_1$. The first current path lot the second current path Ip2 and the third current path Ip3 are coupled between a supply voltage $V_d$ and a ground voltage $V_{gnd}$. The first current source 606 further comprises a first current mirror circuit 602 and all current paths flow through this first current mirror circuit 602. In the example of FIG. 6, the first current mirror circuit 602 comprises four MOS transistors P13, P14, P15 and P20 of a p-type. The four MOS transistors are arranged such that a current flowing through the third current path Ip3 flows through MOS transistor P15. The gate of the MOS transistor P15 is coupled to the drain of MOS transistor P15, and the voltage of this coupled drain-gate is also provided to the gates of MOS transistors P13, P14 and P20—the sources of MOS transistors P13, P14, P15 and P20 are coupled to the supply voltage $V_d$. In this configuration, the current which flows through MOS transistor P15 (and, consequently, through the third current path Ip3) flows also through MOS transistors P13, P14 and P20. MOS transistor P13 is provided in the first current path lot MOS transistor P14 is provided in the second current conduction path P14 and MOS transistor P20 is provided in the first output current path $I_{pos}=I_1$.

The first current path Ip1 comprises a series arrangement of a first bipolar npn transistor T1 and a first resistor R1. The first transistor T1 is coupled with its collector to the first current mirror circuit 602 (and, thus, to the drain of MOS transistor P13), with its emitter to the first resistor R1 and with its base to its emitter. The first resistor R1 is coupled in between the ground voltage $V_{gnd}$ and the emitter of the first transistor T1. The second current path Ip2 comprises a second bipolar npn transistor T1 which has characteristics which are almost all equal to the characteristics of the first transistor T1, only transistor T1 has a larger emitter area and the ratio between the emitter area of T1 and the emitter area of T2 is N:1. The transistor T2 is coupled with its base to the base of the first transistor, with its collector to the first current mirror circuit 602 (and, thus, to the drain of MOS transistor P14) and with its emitter to the ground voltage $V_{gnd}$. The third current path Ip3 comprises a third transistor T3 which has characteristics which are equal to the characteristics of the second transistor T2. The third transistor T3 is coupled with its base to the collector of the second transistor T2, with its collector to the first current mirror circuit 602 (and, thus, to the drain and gate of MOS transistor P15), and with its emitter to the ground voltage $V_{gnd}$.

In the first current source 606 a base of the second transistor T2 receives a first base-emitter voltage $V_{be1}$ and a base of the third transistor T3 receive a second base-emitter voltage $V_{be2}$ plus a voltage which is formed by the current through the first current path Ip1 multiplied by the resistance of resistor R1. Thus, the base of the third transistor T3 receives a voltage $V_{be2}$+Ip1·R1. The base-emitter voltage difference between T2 and T3 is $\Delta V_{be}$ and the voltage difference depends on temperature. In the circuit of FIG. 6, the formula which describes the value of the base-emitter voltage difference $\Delta V_{be}$ is:

$$\Delta V_{be} = \frac{kT}{q}\ln(N),$$

wherein k is the Boltzmann constant, q is the magnitude of the electrical charge on an electron, T is the temperature, and N is the value of N from the emitter-area ratio N:1 (wherein the emitter area of the first transistor T1 is divided by the emitter area of the second transistor T2). Consequently, the current flowing through the first current path, the second current path, the third current path and the output current path is equal to $$I_1 = I_{pos} = \frac{\Delta V_{be}}{R1} = \frac{kT}{qR_1}$$

In (N), wnerein R1 is the resistance of resistor R1.

Although not strictly necessary for the generation of the first current $I_{pos}=I_1$, the feedback loop of the first current source comprises a series arrangement of a first stabilizing resistor Rz1 and a first stabilizing capacitor Cz1 which is coupled between the base of the third transistor T3 and the ground voltage $V_{gnd}$. Oscillations are prevented and the loop has a good phase and gain margin.

It is to be noted that, as described and claimed, the current paths are provided between the supply voltage $V_d$ and the ground voltage $V_{gnd}$. It is assumed that the complete current flowing through, for example, MOS transistor P13 also flows through the first transistor T3 and the first resistor. The same applies to the second current path Ip2 and the third current path Ip3: currents through P14 and P15 also flow, respectively, through the second transistor T2 and the third transistor T3. In practice relatively small current flow also to the bases of the respective transistors and, thus, the current through MOS transistors P13 . . . P15 may slight deviate from current respectively through transistors T3 . . .T3.

A further advantage of the presented first current source 606 is that the first current source 606 also operates with a relatively small supply voltage $V_d$—often a much smaller supply voltage than known prior art current sources which provide a current varying with temperature. Additionally, the first current source 606 provides a current which has a good power supply rejection ration (PSRR), which means that, if the supply voltage $V_d$ varies, the current $I_{pos}=I_1$ provided by the first current source 606 does not vary much.

The first current source 606, as presented in FIG. 6, provides a current which varies with a positive temperature coefficient factor with temperature (thus, the current increases with an increasing temperature). The circuit is suitable for use in the temperature coefficient factor circuits of previous embodiments and previous Figures. However, it is to be noted that the first current source 606 may also be used in other circuits which require a current source which has the above discussed characteristics. In other words, the use and application of the first current source 606 does not depend on characteristics of the temperature coefficient factor circuits.

At the right end of FIG. 6 is provided an example of the second current source 610 which provides a current which varies with temperature according to the negative temperature coefficient factor. The second current source 610 comprises four current conduction paths, which are a fourth current path Ip4, a fifth current path Ip5, a sixth current path Ip6 and a second output current path $I_{neg}=I_2$. The fourth current path Ip4, the fifth current path Ip5 and the sixth current path Ip6 are coupled between a supply voltage $V_d$ and a ground voltage $V_{gnd}$. The second current source 610 further comprises a second current mirror circuit 608 and all current paths flow through this second current mirror circuit 608. In the example of FIG. 6, the second current mirror circuit 608 comprises four MOS transistor P16, P17, P18 and P19 of a p-type. The four MOS transistors are arranged such that a current flowing through the sixth current path Ip6 flows through MOS transistor P18. The gate of the MOS transistor P18 is coupled to the drain of MOS transistor P18, and the voltage of this coupled drain-gate is also provided to the gates of MOS transistors P16, P17 and P19—the sources of the MOS transistors P16, P17, P18 and P19 are coupled to the supply voltage $V_d$. In this configuration, the current which flows through MOS transistor P18 (and, consequently, through the sixth current path Ip6) flows also through MOS transistors P16, P17 and P19. MOS transistor P16 is provided in the fourth current path Ip4. MOS transistor P17 is provided in the fifth current path Ip5. MOS transistor P19 is provided in the second output current path $I_{neg}=I_2$.

The fourth current path Ip4 comprises a second resistor R2. The second resistor R2 is coupled in between the second current mirror circuit 608 and the ground voltage $V_{gnd}$—in other words, the second resistor R2 is coupled in between the drain of MOS transistor P16 and the ground voltage $V_{gnd}$. The fifth current path Ip5 comprises a fourth bipolar npn transistor T4. The base of the transistor is coupled to a terminal shared by the second resistor R2 and the second current mirror circuit 608. The fourth transistor T4 is further coupled with its collector to the second current mirror circuit 608 (i.e. the drain of MOS transistor P17) and with its emitter to the ground voltage $V_{gnd}$. The sixth current path Ip6 comprises a fifth npn transistor T5 with characteristics which are equal to the characteristics of the fifth transistor T5. A base of transistor T5 is coupled to a terminal shared by the collector of the fourth transistor T4 and the second current mirror circuit 608, a collector of the fifth transistor T5 is coupled to the second current mirror circuit (i.e. the drain of MOS transistor P18), and an emitter of the fifth transistor T5 is coupled to the ground voltage $V_{gnd}$ The operation of the second current source 610 is as follows: the second resistor R2, the fourth transistor T4 and the fifth transistor T5 are arranged such that the current which flows through the different current paths Ip4, Ip5, Ip6, $$I_{neg} = I_2 = \frac{V_{be}}{R_2}$$

varies with temperature according to a negative temperature coefficient factor. Taking the derivative of $I_{neg}$ with respect to temperature results in $$\frac{\Delta I_{neg}}{\Delta T} = \frac{F(T)}{R_2 T}$$

with F(T) a function of temperature. Even if the variation of $I_{neg}$ is not a constant with regards to the temperature T, it is always a negative value.

Although not strictly necessary for the generation of the second current $I_{neg}=I_2$, the feedback loop of the second current source comprises a series arrangement of a second stabilizing resistor Rz2 and a second stabilizing capacitor Czb 2 which is coupled between the base of the fifth transistor T5 and the ground voltage $V_{gnd}$. Oscillations are prevented and the loop has a good phase and gain margin.

A further advantage of the presented second current source 610 is that the second current source 610 also operates with a relatively small supply voltage $V_d$—often a much smaller supply voltage than known prior art current sources which provides a current varying with temperature. Additionally, the second current source 610 provides a current which has a good power supply rejection ration (PSRR), which means that, if the supply voltage $V_d$ varies, the current $I_{neg}=I_2$ provided by the second current source 610 does not vary much.

The second current source 610, as presented in FIG. 6, provides a current which varies with a negative temperature coefficient factor with temperature, which means that if the temperature increases, the current decreases. The circuit is suitable for use in the temperature coefficient factor circuits of previous embodiments and previous Figures. However, it is to be noted that the second current source 610 may also be used in other circuits which require a current source which has the above discussed characteristics. In other words, the use and application of the second current source 610 does not depend on characteristics of the temperature coefficient factor circuits.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections. Furthermore, the meaning of the term "coupled" is broader than the term "connected". When a first element is coupled to a second element, other elements may be in between the first element and the second element to provide the coupling. Between electrical elements being coupled to each other exists a direct or indirect voltage or current connection.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa.

Because the amplification stages and the wideband power amplifiers according to the present invention are, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A temperature coefficient factor circuit comprising:
a first current source configured to provide a first current that varies with a temperature according to a positive temperature coefficient factor, wherein the positive temperature coefficient factor has a positive value;
a second current source configured to provide a second current that varies with the temperature according to a negative temperature coefficient factor, wherein the negative temperature coefficient factor has having a negative value;
a common terminal;
a first programmable amplifying current mirror, coupled to the common terminal, and configured to conduct a first amplified current to the common terminal, wherein
a first input current is amplified by the first programmable amplifying current mirror according to a first amplification factor,
the first input current is one of the first current or the second current, and
the first programmable amplifying current mirror is, configured to adapt the first amplification factor in dependence of a control signal;
a second programmable amplifying current mirror, coupled to the common terminal, and configured to conduct a second amplified current away from the common terminal, wherein
a second input current is amplified by the second programmable amplifying current mirror according to a second amplification factor,
the second input current is another one of the first current or the second current, and
the second programmable amplifying current mirror is configured to adapt the second amplification factor in dependence of the control signal;
a current output circuit, coupled to the common terminal, and configured to conduct a difference current away from the common terminal and to provide an output current that varies with a temperature according to a required temperature coefficient factor, wherein the difference current is substantially equal to the first amplified current minus the second amplified current, and the output current is based on the difference current.

2. A temperature coefficient factor circuit according to claim 1, wherein the first programmable amplifying current mirror comprises:
a first MOS transistor of a first type; and
a plurality of parallel arranged first mirror MOS transistors of the first type, wherein
the first MOS transistor is arranged in a current conduction path of the first input current,
at least one of the plurality of first mirror MOS transistors is coupled to the first MOS transistor,
each one of first mirror MOS transistors is configured to
mirror the first input current flowing through the first MOS transistor when coupled to the first MOS transistor, and
conduct the mirrored first input current to the common terminal, and
the first amplification factor is based on the number of first mirror MOS transistors being coupled to the first MOS transistor.

3. A temperature coefficient factor circuit, according claim 2, wherein the first programmable amplifying current mirror is configured to connect a specific number of the plurality of the first mirror MOS transistors to the first MOS transistor in dependence of the control signal.

4. A temperature coefficient factor circuit according to claim 3, wherein the first programmable amplifying current mirror comprises:
a first controller configured to process the control signal and to couple a specific number of the first mirror MOS transistors to the first MOS transistor, wherein the first controller is further configured to
calculate a ratio $$R = \frac{TCF_{wanted} - TCF_2}{TCF_{wanted} - TCF_1}$$

wherein TCFwanted is the required temperature coefficient factor for the output current of the current output circuit, TCF1 is a temperature coefficient factor of the first input current, and TCF2 is a temperature coefficient factor of the second input current,
find integer numbers A and B which provide, when A is divided by B, approximately the ratio R, and
couple the first mirror MOS transistors to the first MOS transistor.

5. A temperature coefficient factor circuit according to claim 1, wherein the second programmable amplifying current mirror comprises:

a second MOS transistor of a second type; and a plurality of parallel arranged second mirror MOS transistors of the second type, wherein the second MOS transistor arranged in a current conduction path of the second input current, at least one of the plurality of second mirror MOS transistors is coupled to the second MOS transistor, each one of second mirror MOS transistors is configured to mirror the second input current flowing through the second MOS transistor when being coupled to the second MOS transistor, and conduct the mirrored second input current away from the common terminal, and the second amplification factor is based on the number of second mirror MOS transistors being coupled to the second MOS transistor.

6. A temperature coefficient factor circuit according claim 5, wherein the second programmable amplifying current mirror is configured to connect a specific number of the plurality of the second mirror MOS transistors to the second MOS transistor in dependence of the control signal.

7. A temperature coefficient factor circuit according to claim 4, wherein the second programmable amplifying current mirror comprises:

a second controller configured to process the control signal and couple a specific number of the second mirror MOS transistors to the second MOS transistor, wherein the second controller is configured to calculate the same ratio R as the first controller, find the same integer numbers A and B as the first controller, and couple a number of B second mirror MOS transistors to the second MOS transistor.

8. A temperature coefficient factor circuit according to claim 5, wherein the current output circuit is configured to provide the output current as a divided mirror current based on the difference current according to a division factor, the division factor being dependent on the control signal, and the current output circuit comprises:

a plurality of parallel arranged output mirror MOS transistors, and an output MOS transistor, wherein the output MOS transistor is arranged in a current conduction path of the output current, at least one of the plurality of output mirror MOS transistors is arranged in a current conduction path of the difference current and is coupled to the output MOS transistor, each one of the plurality of output mirror MOS transistors is configured to conduct a portion of the difference current when being arranged in the current conduction path of the difference current and being coupled to the output MOS transistor, and the portion of the difference current conducted by a single output mirror MOS transistor is equal to the output current conducted by the output MOS transistor.

9. A temperature coefficient factor circuit, according to claim 8, wherein the current output circuit is configured to arrange a specific number of the plurality of the output mirror MOS transistors in the current conduction path of the difference current, and couple the specific number of the plurality of the output mirror MOS transistors to the output MOS transistor.

10. A temperature coefficient factor circuit according to claim 7, wherein the current output circuit comprises a third controller configured to:

process the control signal, arrange a specific number of the output mirror MOS transistors in the current conduction path of the difference current, couple the specific number of output mirror MOS transistors to the output MOS transistor calculate the same ratio R as the first controller, find the same integer numbers A and B as the first controller, calculate C=A−B, and arrange C output mirror MOS transistors in the current conduction path of the difference current and/or couple C output mirror MOS transistors to the output MOS transistor.

11. A temperature coefficient factor circuit according to claims 1 further comprising:

a switching unit configured to control the mirroring of the first current by the first programmable amplifying current mirror and the mirroring of the second current by the second programmable amplifying current mirror, or to control the mirroring of the first current by the second programmable amplifying current mirror and to control the mirroring of the second current by the first programmable amplifying current mirror, wherein the switching unit is configured to base the controlling on the control signal.

12. A temperature coefficient factor circuit according to claim 1, wherein the first amplification factor and/or the second amplification factor is an integer number.

13. A temperature coefficient factor circuit according to claim 1, wherein the first current source comprises a first, a second and a third current path coupled between a supply voltage and a ground voltage;

a first output current path for providing the first current;

a first current mirror circuit for mirroring a current of the third current path to a current of the first current path , a current of the second current path and to the first current conducted by the first output current path, wherein the first current path comprises a series arrangement of a first resistor and a first transistor, the first transistor is coupled with a collector of the first transistor to the first current mirror circuit, with an emitter of the first transistor to the first resistor and with a base of the first transistor to the collector of the first transistor, the first resistor is coupled between the first transistor and a ground voltage, the second current path comprises a second transistor coupled with a base of the second transistor to the base of the first transistor, with a collector of the second transistor to the first current mirror circuit and with an emitter of the second transistor to the ground voltage, the third current path comprises a third transistor coupled with a base of the third transistor to the collector of the second transistor, with a collector of the third transistor to the first current mirror circuit and with an emitter of the third transistor to the ground voltage, and the first transistor, the second transistor and the third transistor are bipolar npn transistors with matching characteristics, the second transistor and the third transistor being equal and the first transistor and the second transistor have an emitter area ratio of N:1, wherein N is a value larger than 1 and represents the emitter area of the first transistor.

14. A temperature coefficient factor circuit according to claim 13 further comprising a first series arrangement of a first stabilizing resistor and a first stabilizing capacitor, wherein the first series arrangement is coupled in between the base of the third transistor and the ground voltage.

15. A temperature coefficient factor circuit according to claims 1, wherein the second current source comprises:

a fourth, a fifth and a sixth current path coupled between the supply voltage and the ground voltage;

a second output current path for providing the second current;

a second current mirror circuit configured to mirror a current of the sixth current path to a current of the fourth current path, a current of the fifth current path and to the second current conducted by the second output current path, wherein the fourth current path comprises a second resistor coupled between the second current mirror circuit and the ground voltage, the fifth current path comprises a fourth transistor coupled with a base of the fourth transistor to a terminal of the fourth current path shared by the second resistor and the second current mirror circuit, with a collector of the fourth transistor to the second current mirror circuit and with an emitter of the fourth transistor to the ground voltage, the sixth current path comprises a fifth transistor coupled with a base of the fifth transistor to the collector of the fourth transistor, with a collector of the fifth transistor to the second current mirror circuit and with an emitter of the fifth transistor to the ground voltage, the fourth transistor and the fifth transistor are matching bipolar npn transistors with equal characteristics.

16. A temperature coefficient factor circuit according to claim 15, further comprising:

a second series arrangement of a second stabilizing resistor and a second stabilizing capacitor, wherein the second series arrangement is coupled in between the base of the fifth transistor and the ground voltage.

17. A semiconductor device comprising a temperature coefficient factor circuit according to claim 1 for compensating a temperature dependent operation of a part of a circuitry of the semiconductor device or for introducing a temperature dependent operation of a part of a circuitry of the semiconductor device.

18. A radar device comprising a temperature coefficient factor circuit according to claims 1 for compensating a temperature dependent operation of a part of a circuitry of the semiconductor device or for introducing a temperature dependent operation of a part of a circuitry of the semiconductor device.

* * * * *